United States Patent
Park et al.

(10) Patent No.: US 10,629,251 B2
(45) Date of Patent: Apr. 21, 2020

(54) SEMICONDUCTOR MEMORY SYSTEM AND OPERATING METHOD THEREOF

(71) Applicant: SK hynix Inc., Gyeonggi-do (KR)

(72) Inventors: Sang-Gyu Park, Seoul (KR); Il-Young Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/690,519

(22) Filed: Aug. 30, 2017

(65) Prior Publication Data

US 2018/0061466 A1   Mar. 1, 2018

Related U.S. Application Data

(63) Continuation of application No. PCT/KR2017/007187, filed on Jul. 5, 2017.

(30) Foreign Application Priority Data

Aug. 30, 2016 (KR) .................. 10-2016-0110491
Nov. 7, 2016 (KR) .................. 10-2016-0147219

(51) Int. Cl.
*G11C 11/16* (2006.01)
*G11C 13/00* (2006.01)

(52) U.S. Cl.
CPC ...... *G11C 11/1673* (2013.01); *G11C 11/1675* (2013.01); *G11C 11/1677* (2013.01); *G11C 13/004* (2013.01); *G11C 13/0064* (2013.01); *G11C 13/0069* (2013.01); *G11C 2013/0054* (2013.01); *G11C 2013/0066* (2013.01)

(58) Field of Classification Search
CPC .................. G11C 11/1673; G11C 11/1675
See application file for complete search history.

(56) References Cited

U.S. PATENT DOCUMENTS

| 6,260,103 | B1 | 7/2001 | Alexis et al. |
| 6,574,145 | B2* | 6/2003 | Kleveland ............ G11C 7/062 365/185.14 |
| 7,920,405 | B2* | 4/2011 | Kang ................ B82Y 10/00 365/148 |
| 8,416,605 | B2* | 4/2013 | Kono ............. G11C 13/0002 365/148 |
| 2002/0080661 | A1 | 6/2002 | Gogl et al. |
| 2007/0153593 | A1 | 7/2007 | Chen |
| 2010/0195370 | A1 | 8/2010 | Shiimoto et al. |
| 2016/0093350 | A1 | 3/2016 | Jung et al. |
| 2016/0267969 | A1* | 9/2016 | Ogiwara ............ G11C 13/004 |
| 2016/0276010 | A1* | 9/2016 | Takaya ............ G11C 11/1675 |

FOREIGN PATENT DOCUMENTS

KR   1020150046974   5/2015

OTHER PUBLICATIONS

Office Action issued by the Korean Intellectual Property Office dated Mar. 9, 2018.

* cited by examiner

*Primary Examiner* — Tri M Hoang
(74) *Attorney, Agent, or Firm* — IP & T Group LLP

(57) ABSTRACT

A semiconductor memory system comprising: a memory device including a plurality of data cells; a read/write circuit suitable for performing a write operation to a target data cell among the data cells; and a state transition recognition circuit suitable for detecting a state transition of the target data cell, and ending the write operation according to the detection result of the state transition of the target data cell.

20 Claims, 11 Drawing Sheets

SEMICONDUCTOR MEMORY SYSTEM AND OPERATING METHOD THEREOF

CROSS-REFERENCE TO RELATED APPLICATIONS

The present application claims priority of Korean Patent Application No. 10-2016-0110491, filed on Aug. 30, 2016, and Korean Patent Application No. 10-2016-0147219, filed on Nov. 7, 2016, and International Application No. PCT/KR2017/007187, filed on Jul. 5, 2017, which are incorporated herein by reference in its entirety.

BACKGROUND

1. Field

Exemplary embodiments of the present invention relate to a memory device, and a method for operating the memory device.

2. Description of the Related Art

A Random Access Memory (RAM) may be a volatile memory or a non-volatile memory. Whereas a volatile RAM loses data stored therein whenever the power supply is cut off, a non-volatile RAM may retain its memory contents even though the power supply is cut off.

Although the non-volatile RAM has the advantage of retaining data even though the power supply is cut off, the non-volatile RAM may generally require longer time to perform a read operation and/or a write operation than the volatile RAM.

A magneto-resistive Random Access Memory (MRAM) is a non-volatile memory whose read/write time is as fast as the volatile memory. Differently from the typical RAM technology that stores data based on the electric charges or current flows the MRAM may store data based on the magnetic currents.

FIGS. 1A and 1B are perspective views of a Magnetic Tunnel Junction (MTJ), and FIGS. 2A and 2B illustrate a structure of an MRAM cell.

Referring to FIGS. 1A to 2B the MRAM cell may include an MTJ and a transistor MN. One end of the MTJ may be coupled to a bit line BL while the other end of the MTJ may be coupled to the drain of the transistor MN. The gate of the transistor MN may be coupled to a word line WL. The source of the transistor MN may be coupled to a source line SL.

The MTJ may include a pinned layer 100, a tunnel barrier layer 102, and a free layer 104. The pinned layer 100 and the free layer 104 may be formed of a ferroelectric material, and may individually have a magnetization direction. The pinned layer 100 and the free layer 104 may be isolated from each other by the tunnel barrier layer 102.

The pinned layer 100 may have a particular polarity, and the polarity of the free layer 104 may be freely changed to coincide with the polarity of an applied external field.

The change in the polarity of the free layer 104 may change the resistance of the MTJ. For example, when the polarities are aligned to the same direction as illustrated in FIG. 1A, the MTJ may have a low resistance. When the polarities are not aligned to the same direction as illustrated in FIG. 1B, the MTJ may have a high resistance. The data stored in a data cell may become '0' or '1', according to the resistance state of the MTJ.

MRAM cells may be formed in the form of an array, and a memory device may include a plurality of arrays.

According to conventional technology, an MRAM device may include a read circuit and a write circuit separately, or include one circuit that integrates the read circuit and the write circuit. A memory device that includes a read circuit and a write circuit separately may detect whether or not the state transition of a data cell has occurred only at a predetermined temporal or short interval. Therefore, if the state transition of the data cell occurs at a moment between detection operations, the write operation cannot stop and repeats until the state transition of the data cell is detected.

According to conventional technology, a memory device that includes read and write circuits integrated therein does not detect whether or not a state transition of a data has occurred. Instead, the memory device keeps performing a write operation for a time sufficient to secure the state transition of a data cell, and then stops the write operation, without performing any detection operation.

To sum up, since the conventional MRAM device continues to perform a write operation even though state transition of the data cell has occurred, power is unnecessarily consumed during the write operation.

SUMMARY

Embodiments of the present invention are directed to a memory device and an operating method thereof capable of stopping a write operation when a state transition of a data cell occurs. The memory device may have an integrated read and write circuit. The memory device may detect when a state transition of a data cell occurs during a write operation and stop the write operation. The detection of a state transition may be made substantially instantly or much faster than conventional technology. The memory device may be an MRAM.

In accordance with an embodiment of the present invention, a semiconductor memory system includes: a memory device including a plurality of data cells; a read/write circuit suitable for performing a write operation to a target data cell among the data cells; and a state transition recognition circuit suitable for detecting a state transition of the target data cell, and ending the write operation according to the detection result of the state transition of the target data cell.

The data cells may include a reference cell having a reference resistance.

The state transition recognition circuit may end the write operation by providing a state transition recognition signal to the read/write circuit.

The state transition recognition circuit may end the write operation by providing the read/write circuit with the state transition recognition signal, which has a first logic level to deactivate the read/write circuit according to the detection result of the state transition of the target data cell.

The state transition recognition circuit may detect the state transition of the target data cell by comparing a resistance of the target data cell with the reference resistance of the reference cell.

When a current state of the target data cell represents data to be written into the target data cell, the state transition recognition circuit may provide the read/write circuit with the state transition recognition signal of the first logic level.

When the current state of the target data cell does not represent the data to be written into the target data cell, the state transition recognition circuit may provide the read/write circuit with the state transition recognition signal of a second logic level.

The state transition recognition circuit may become activated at a start of the write operation, and the state transition recognition circuit may become deactivated at a completion of the state transition of the target data cell.

In accordance with another embodiment of the present invention, a plurality of data cells, the method comprising: performing a write operation to a target data cell among the data cells; detecting a state transition of the target data cell; and ending the write operation according to the detection result of the state transition of the target data cell.

The data cells may include a reference cell having a reference resistance.

The ending of the write operation may include providing a state transition recognition signal to the read/write circuit.

The ending of the write operation may include providing the read/write circuit with the state transition recognition signal, which has a first logic level to deactivate the read/write circuit according to the detection result of the state transition of the target data cell.

The detecting of the state transition may include comparing a resistance of the target data cell with the reference resistance of the reference cell.

The state transition recognition signal of the first logic level may be provided when a current state of the target data cell represents data to be written into the target data cell.

The ending of the write operation may include providing the read/write circuit with the state transition recognition signal of a second logic level when the current state of the target data cell does not represent the data to be written into the target data cell.

In accordance with another embodiment of the present invention, a state transition recognition circuit comprising: a comparator coupled to a read/write circuit which controls a write operation in a memory system, and a state transition recognition unit suitable for outputting a state transition recognition signal based on an output of the comparator, wherein the state transition recognition circuit decides whether to end a write operation of the read/write circuit.

The comparator may output a comparison signal according to whether or not a current state of the target data cell represents data to be written into the target data cell.

When the current state of the target data cell represents data to be written into the target data cell, the state transition recognition unit may provide the read/write circuit with the state transition recognition signal, which has a first logic level to deactivate the read/write circuit.

When the current state of the target data cell does not represent the data to be written into the target data cell, the state transition recognition unit may provide the read/write circuit with the state transition recognition signal of a second logic level.

The state transition recognition circuit may become activated at a start of the write operation, the state transition recognition circuit may become deactivated at a completion of the state transition of the target data cell; and the comparator may compare a resistance of the target data cell with a reference resistance of a reference cell.

The comparator may compare a resistance of the data cell with a reference resistance of a reference cell, and when a state of the data cell is different from a result of the write operation, the state transition recognition circuit may stop an operation of the read/write device.

DETAILED DESCRIPTION

Figure 1A:
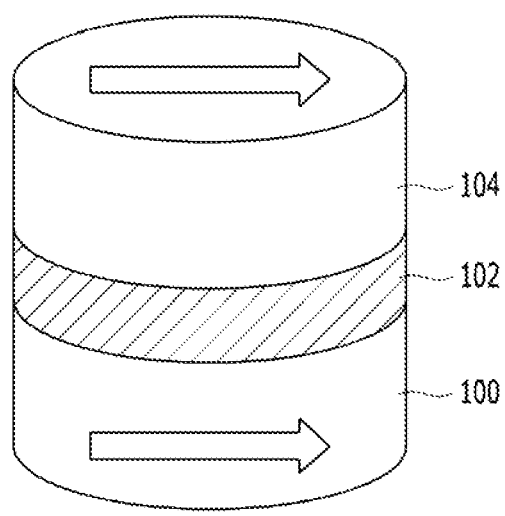
FIGS. 1A and 1B are perspective views of an MTJ.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The singular expression appearing in this patent specification may include plural as well, if it is described otherwise in the context. Throughout the specification, the terms 'comprise' and 'include' should not be construed to necessarily including all the constituent elements or steps described in the specification, and they should be construed to not only including all the constituent elements or steps but also including some of the constituent elements or steps or further including additional constituent elements or steps. The terms 'unit' and 'module' are used interchangeably, may process at least one function or operation, and may be realized in the form of hardware or software, or a combination of hardware and software.

Figure 1B:
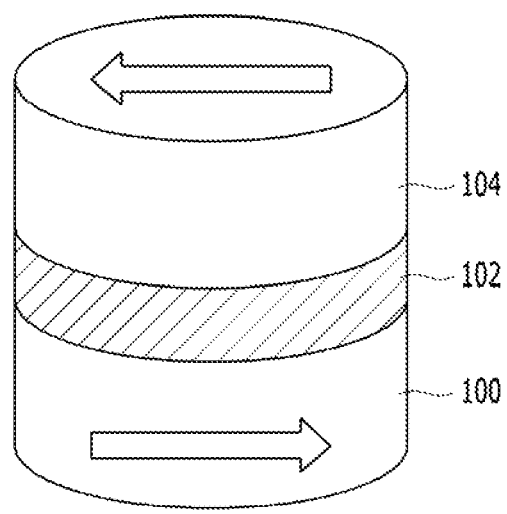
Figure 2A:
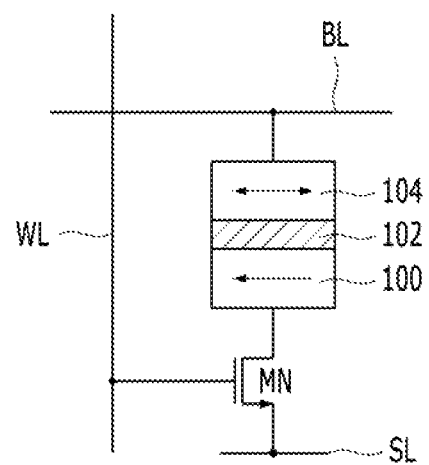
FIGS. 2A and 2B illustrate a structure of an MRAM cell.
Figure 2B:
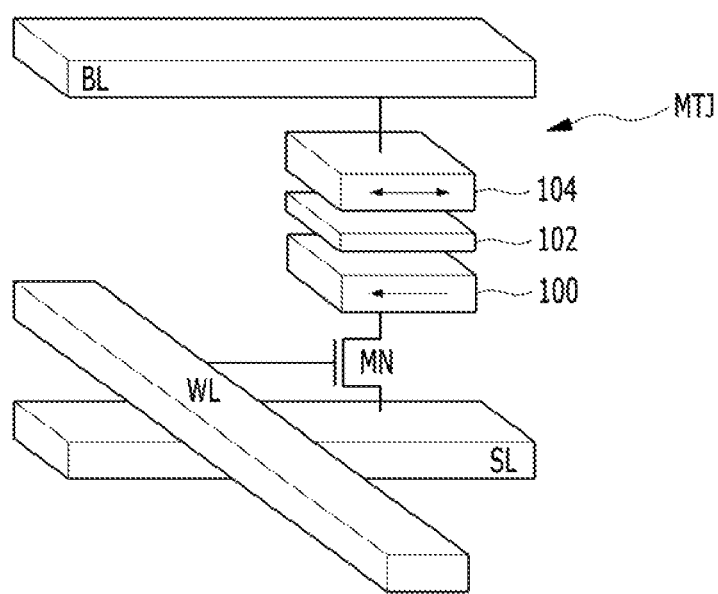

A memory device, e.g., a magnetic resistive memory device, may recognize transition of the state of a Magnetic Tunnel Junction (MTJ) that is included in a data cell. Referring back to FIG. 1, the transition of the state of the MTJ may signify a change in the polarity of a free layer 104. The change in the polarity of the free layer 104 may vary the resistance of the MTJ.

Figure 3A:
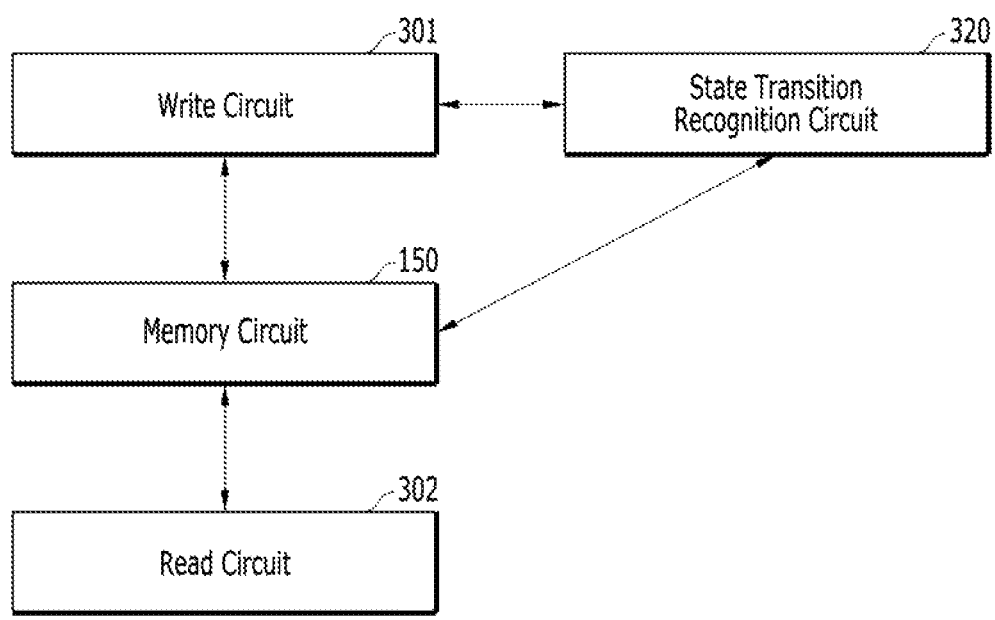
FIGS. 3A and 3B are block diagrams illustrating a magnetic resistive memory device according to a prior art.
Figure 3B:
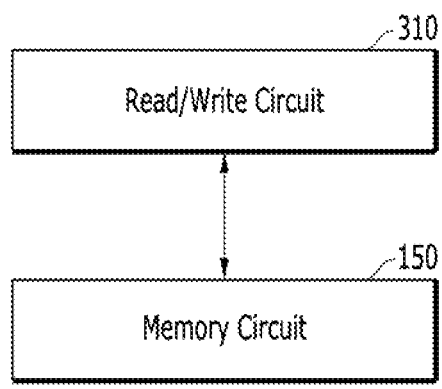

FIGS. 3A and 3B are block diagrams illustrating a magnetic resistive memory device according to a prior art.

FIG. 3A shows a magnetic resistive memory device including a read circuit 302 and a white circuit 301 that are realized separately. FIG. 3B shows a magnetic resistive memory device including a read circuit and a write circuit that are integrated.

Referring to FIG. 3A, for the magnetic resistive memory device to recognize the state transition of the MTJ, the magnetic resistive memory device may have to stop an ongoing write operation and check out whether the state transition of a data cell has occurred or not. According to conventional technology, the magnetic resistive memory device can detect whether the state transition of a data cell has occurred or not only at a predetermined temporal interval. Therefore, when the state transition of the data cell occurs between the detection operations of the predetermined interval, the write operation cannot stop until following detection operation is performed. In other words an existing magnetic resistive memory device cannot recognize the state transition of the MTJ during the ongoing write operation.

Referring to FIG. 3B, the magnetic resistive memory device includes a read circuit and a write circuit that may be realized into a single circuit. The read circuit may be able to perform only a read operation for reading a data and may not be able to perform a read operation for detecting whether a state transition of a data cell has occurred or not. Therefore, the magnetic resistive memory device may not be able to recognize the state transition of the data cell. Hence the memory device keeps performing a write operation for a sufficiently long time in order to secure the state transition of a data cell without the detection operation, and then stops the write operation. In this case, the overall delay of the write operation is increased and power is consumed unnecessarily.

The present invention provides a memory device having an integrated read and write circuit and which is capable of stopping a write operation substantially instantly or much faster than conventional technology when a state transition of a data cell occurs.

In accordance with an embodiment of the present invention, a semiconductor memory system is provided which includes a memory device that includes a data cell, an integrated read/write circuit suitable for controlling a read operation and a write operation that are performed onto the data cell, and a state transition recognition circuit suitable for recognizing a state transition of the data cell where the write operation is performed. The state transition recognition circuit detects the state transition of the data cell where the write operation is performed, disables the read/write device and ends the write operation according to the state transition of the data cell.

The memory device may include a reference cell having a reference resistance to be compared with a resistance of the data cell.

The read/write device may decide whether to end the write operation or not based on a state transition recognition signal that is inputted to the read/write device.

The state transition recognition signal may be outputted from the state transition recognition circuit and decide whether to perform a write operation or not in the read/write device.

The state transition recognition circuit may compare the resistance of the data cell with the reference resistance of the reference cell and when a state of the data cell coincides with a result of the write operation, the state transition recognition circuit may output a state transition recognition signal for stopping the write operation of the read/write device.

The state transition recognition circuit may compare the resistance of the data cell with the reference resistance of the reference cell, and when a state of the data cell is different from a result of the write operation, the state transition recognition circuit may output a state transition recognition signal for maintaining the write operation of the read/write device.

The state transition recognition circuit may begin an operation when the write operation is performed, and when a state transition of the data cell where the write operation is performed occurs, the state transition recognition circuit may stop the operation.

In accordance with another embodiment of the present invention, a state transition recognition circuit is provided that is suitable for deciding whether to end a write operation of a read/write device which controls a read operation and a write operation in a memory system. The state transition recognition circuit includes a comparator that is coupled to the read/write device, and a state transition recognition circuit suitable for outputting a state transition recognition signal based on an output of the comparator.

The comparator may compare a data to be written in a selected data cell with a current state of the data cell that is selected according to a driving of the read/write device and output a comparison signal.

When the state transition recognition circuit decides based on the outputted comparison signal that a data to be written in the selected data cell coincides with a current state of the selected data cell, the state transition recognition circuit may apply a state transition recognition signal for disabling the read/write device to the read/write device.

When the state transition recognition circuit decides based on the outputted comparison signal that a data to be written in the selected data cell is different from a current state of the selected data cell, the state transition recognition circuit may apply a state transition recognition signal for enabling the read/write device to the read/write device.

The state transition recognition circuit may begin an operation when the write operation is performed, and stop the operation when a state transition of the data cell where the write operation is performed occurs.

The comparator may compare a resistance of the data cell with a reference resistance of a reference cell, and when a state of the data cell coincides with a result of the write operation, the state transition recognition circuit may stop an operation of the read/write device.

The comparator may compare a resistance of the data cell with a reference resistance of a reference cell, and when a state of the data cell is different from a result of the write operation, the state transition recognition circuit may stop an operation of the read/write device.

In this specification, it is assumed that the voltage of the data cell and the resistance of the data cell are expressed in an equal manner. The same applies to the reference cell.

Figure 4:
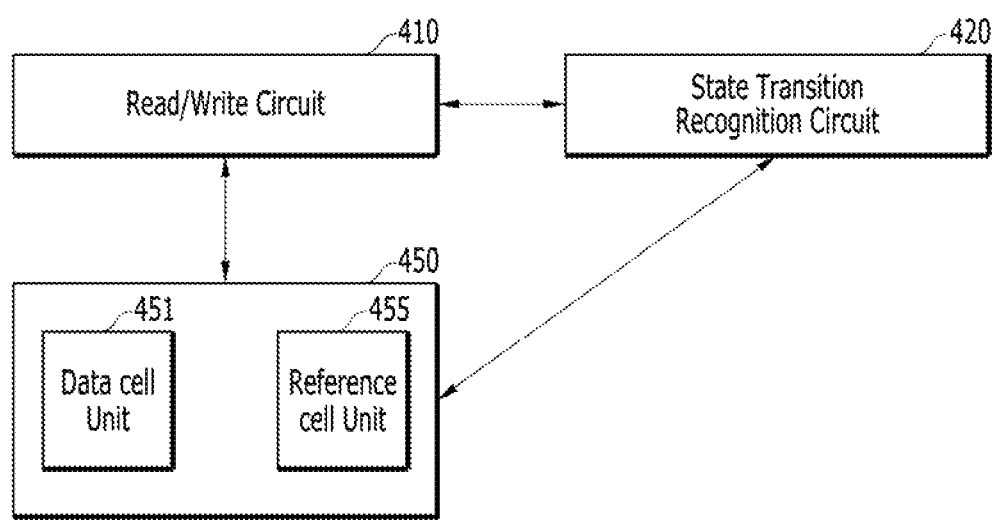
FIG. 4 is a block diagram illustrating a memory device in accordance with an embodiment of the present invention.

FIG. 4 is a block diagram illustrating a memory device in accordance with an embodiment of the present invention. The memory device may be an MRAM.

The memory device may include a memory cell circuit 450, a read/write circuit 410, and a state transition recognition circuit 420. The memory cell circuit 450 may include a data cell unit 451 and a reference cell unit 455.

The data cell unit 451 may include a plurality of data cells that store data. The reference cell unit 455 may include a plurality of reference cells to be compared with different resistance values of the data cells of the data cell unit 451.

The read/write circuit 410 may perform a read operation and a write operation to the data cells of the data cell unit 451 in the memory cell circuit 450.

The state transition recognition circuit 420 may detect a state transition of a target data cell during a write operation in order to check whether an intended data is stored in the target data cell or not, and transfer to the read/write circuit 410 a state transition recognition signal representing the detection result.

According to the embodiment of the present invention, when the read/write circuit 410 receives the state transition recognition signal representing that the state transition of the target data cell has occurred during the write operation, the read/write circuit 410 may be disabled and end the write operation.

Meanwhile, the read/write circuit 410 may perform a read operation, and data of a data cell in the data cell unit 451 may be sensed by a sensing circuit (not shown). As for the sensing circuit, all kinds of sensing circuits may be used as the sensing circuit as long as the sensing circuit is capable of sensing a data by detecting the resistance of a target data cell.

Figure 5A:
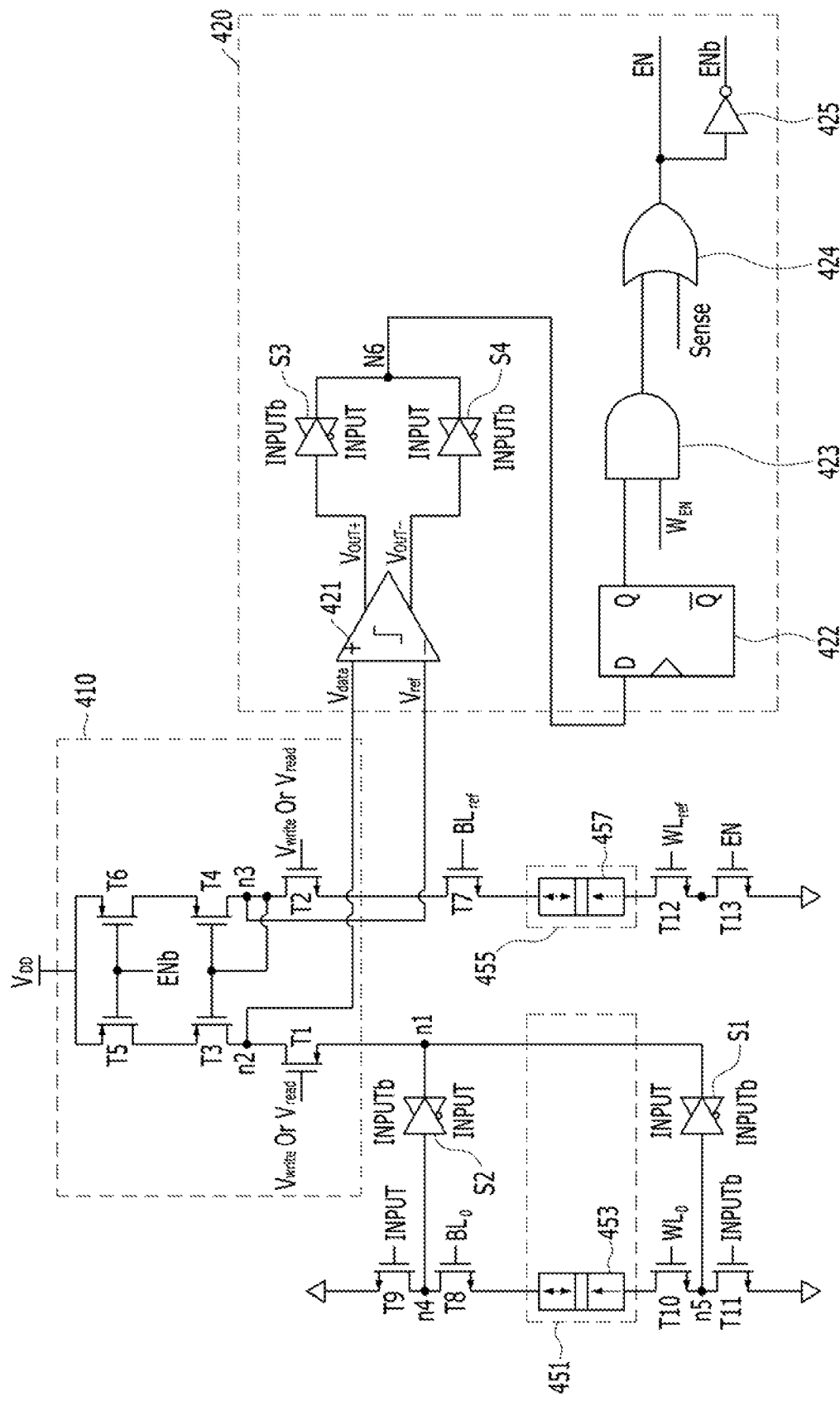
FIGS. 5A to 5C are exemplary circuit diagrams illustrating the memory device shown in FIG. 4.
Figure 5B:
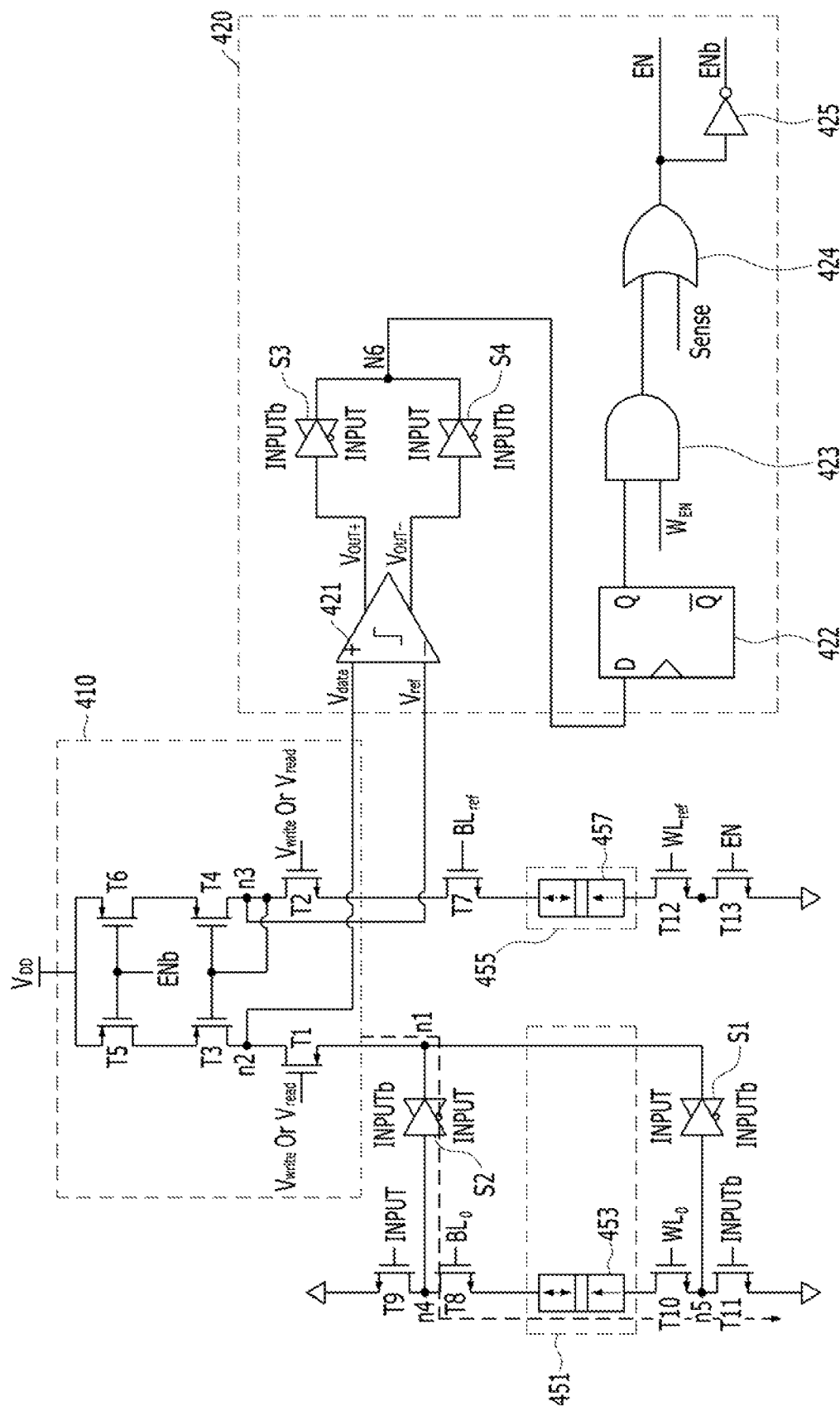
Figure 5C:
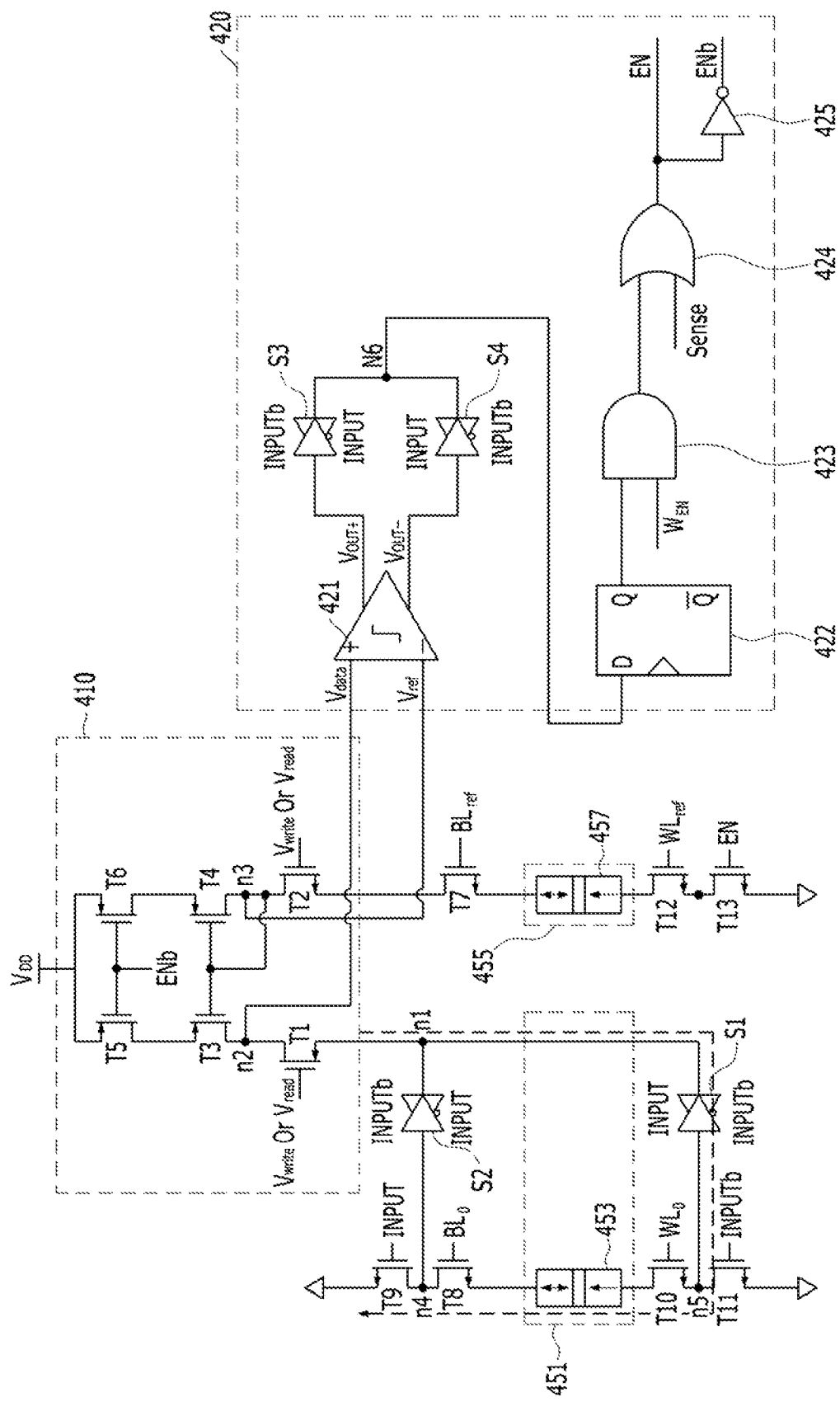

FIGS. 5A to 5C are exemplary circuits illustrating an implementation of the memory device of FIG. 4.

The circuit structures shown in FIGS. 5A to 5C are a single embodiment of the present invention, and, hence, should not limit the scope of the present invention.

Referring to FIG. 5A, the data cell unit 451 may include at least one data cell. For the sake of convenience in description, it is described in FIG. 5A that the data cell unit 451 includes one data cell 453.

According to the embodiment of the present invention, the data cell 453 may be selected by an eighth transistor T8 and a ninth transistor T9, and the data cell 453 may be coupled to a source line SL by a $10^{th}$ transistor T10 and an transistor T11.

A fourth node n4 between the eighth transistor T8 and the ninth transistor T9 may be coupled to a first node n1, which is a coupling node between the data cell unit 451 and the read/write circuit 410, through a second switch S2, e.g., a transmission gate switch.

A fifth node n5 between the $10^{th}$ transistor T10 and the $11^{th}$ transistor T11 may be coupled to the first node n1 through a first switch S1, e.g., a transmission gate switch. Current paths may be formed during a read operation and a write operation by the eighth to $11^{th}$ transistors T8, T9, T10 and T1 and the first and second switches S1 and S2, which will be described later.

The reference cell unit 455 may include at least one reference cell 457. For the sake of convenience in description, it is described in FIG. 5A that the reference cell unit 455 includes one reference cell 457. The reference cell 457 may provide a reference voltage (resistance) during a read operation.

The read/write circuit 410 may perform a read operation and a write operation.

According to the embodiment of the present invention, the read/write circuit 410 may include a plurality of transistors T1 to T6.

A first transistor T1 may be coupled to the data cell unit 451, and a second transistor T2 may be coupled to the reference cell unit 455, A write voltage Vwrite or a read voltage Vread may be applied to the gates of the first transistor T1 and the second transistor T2. In other words, the first transistor T1 and the second transistor T2 may be turned on for read and write operations.

A third transistor T3 and a fifth transistor T5 may be serially coupled between the first transistor T1 and a power source voltage VDD. A fourth transistor T4 and a sixth transistor T6 may be serially coupled between the second transistor T2 and the power source voltage VDD.

The third transistor T3 and the fourth transistor T4 may have a mirror structure. A second node n2 between the first transistor T1 and the third transistor T3 may be coupled to the state transition recognition circuit 420, and a third node n3 between the second transistor T2 and the fourth transistor T4 may be coupled to the state transition recognition circuit 420. Therefore, the voltages of the second node n2 and the third node n3 may be applied to the state transition recognition circuit 420 during a write operation, and the state transition recognition circuit 420 may detect the state transition of the data cell 453 based on the voltages of the second node n2 and the third node n3.

During a write operation and a read operation, a reference bit line signal $BL_{ref}$ and a reference word line signal $WL_{ref}$ of a logic high level may be respectively applied to gates of the seventh and $12^{th}$ transistors T7 and T12, between which the reference cell 457 is coupled. Therefore, the third node n3 may have a voltage of the reference cell 457 during a write operation and a read operation and the current state of the reference cell 457 may be reflected into an inversion input terminal of a comparator 421, which will be described later.

According to the embodiment of the present invention, a second state transition recognition signal ENb outputted from the state transition recognition circuit 420 may be applied to the gates of the fifth and sixth transistors T5 and T6 during a write operation. The second state transition recognition signal ENb may be an inverted signal of a first state transition recognition signal EN.

For example, when the state transition recognition circuit 420 outputs the second state transition recognition signal ENb of a logic high level representing that the state transition of the data cell has occurred, the fifth and sixth transistors T5 and T6 may be turned off to disable the read/write circuit 410. As a result, the write operation may stop.

Also, when the state transition recognition circuit 420 outputs the second state transition recognition signal ENb of a logic low level representing that the state transition of the data cell has not occurred, the fifth and sixth transistors T5 and T6 may be turned on to enable the read/write circuit 410. While the second state transition recognition signal ENb keeps a logic low level, the read/write circuit 410 may stay enabled, and thus the write operation may be performed continuously.

The state transition recognition circuit 420 may include a comparator 421 and a state transition unit. The state transition unit may include third and fourth switches S3 and S4, a D-flipflop 422, an AND gate 423, an OR gate 424, and an inverter 425.

A non-inversion input terminal of the comparator 421 may be coupled to the second node n2, and an inversion input terminal of the comparator 421 may be coupled to the third node n3. The third switch S3 may be coupled to one output terminal of the comparator 421. The fourth switch S4 may be coupled to the other output terminal of the comparator 421.

The D-flipflop 422 may prevent wasteful power consumption of the memory device. The D-flipflop 422 may perform a switching operation repeatedly in response to a clock CLK that is applied to the D-flipflop 422. When the clock CLK has a logic low level, the D-flipflop 422 may not operate. When state transition of the data cell occurs, the clock CLK may stay to the logic low level. As a result, the D-flipflop 422 may not operate. Since the state transition recognition circuit 420 may stop its operation when the state transition of the data cell occurs, the power consumption efficiency of the memory device may be improved.

For example, the clock CLK applied to the D-flipflop 422 may be generated through an AND operation to the first state transition recognition signal EN and a reference clock CLOCK. While the first state transition recognition signal EN has a logic high level before the state transition of the data cell occurs, the clock CLK may be the same as the reference clock CLOCK. Accordingly, the D-flipflop 422 may operate. Conversely, when the state transition of the data cell occurs, the first state transition recognition signal EN comes to have a logic low level and the clock CLK becomes disabled. Accordingly, the D-flipflop 422 may not operate. Therefore, the power consumption efficiency of the memory device may be increased due to the D-flipflop 422.

One input terminal of the AND gate 423 may be coupled to an output terminal of the D-flipflop 422, and a write operation signal $W_{EN}$ may be inputted to the other input terminal of the AND gate 423, The write operation signal $W_{EN}$ may have a logic high level when a write operation is performed. When a write operation is not performed, the write operation signal $W_{EN}$ may have a logic low level.

One input terminal of the OR gate 424 may be coupled to an output terminal of the AND gate 423, and a sense signal SENSE may be inputted to the other input terminal of the OR gate 424. The sense signal SENSE may be used to sense the current state of a target data cell during a write operation. When the write operation signal $W_{EN}$ is enabled, the sense signal SENSE may be enabled to have a logic high level. When the current state of the target data cell is sensed, the logic level of the sense signal SENSE may transition from the logic high level to a logic low level. The transition of the sense signal SENSE may mean identification of the current state of the target data cell during a write operation. Therefore, the state transition of the target data cell may occur when the sense signal has a logic low level. Although not illustrated, a sensing circuit included in the memory device may enable the sense signal SENSE to a logic high level when the write operation signal $W_{EN}$ is enabled, and may disable the sense signal SENSE to a logic low level when identifying the current state of the target data cell during a write operation. As for the sensing circuit, all kinds of sensing circuits may be used as the sensing circuit as long as the sensing circuit is capable of sensing the current state of the target data cell by detecting the resistance of the target data cell.

When the current state of the target data cell represents data to be written into the target data cell, the second state transition recognition signal ENb may have a logic high level and the write operation may end. Since the sense signal SENSE is provided to the OR gate 424, the OR gate 424 may output a signal of a logic high level and thus the second state transition recognition signal ENb may have a logic low level regardless of the logic level of the sense signal SENSE while the current state of the target data cell does not represent data to be written into the target data cell.

The inverter 425 may invert the output signal of the OR gate 424 and output the second state transition recognition signal ENb. Herein, the second state transition recognition signal ENb may be inputted to the gates of fifth and sixth transistors T5 and T6 of the read/write circuit 410.

In accordance with another embodiment of the present invention, a method for operating a semiconductor memory system includes: selecting a data cell included in a memory device; beginning a write operation for writing a data in the selected data cell; and when a state transition occurs in the selected data cell, detecting the state transition of the data cell and ending the write operation according to the state transition of the data cell, wherein the write operation is controlled by a read/write circuit that drives a read operation and a write operation, and when the state transition occurs in the selected data cell, the read/write circuit is disabled.

In the detecting of the state transition of the data cell and the ending of the write operation according to the state transition of the data cell, whether the state transition of the selected data cell occurs or not may be decided by comparing a resistance of the selected data cell with a reference resistance of a reference cell.

In the detecting of the state transition of the data cell and the ending of the write operation according to the state transition of the data cell, whether to end the write operation or not may be decided based on a state transition recognition signal.

The state transition recognition signal may be generated from a moment when the write operation begins to a moment when the state transition of the selected data cell occurs.

In the detecting of the state transition of the data cell and the ending of the write operation according to the state transition of the data cell, the resistance of the selected data cell may be compared with the reference resistance of the reference cell, and when a state of the data cell coincides with a result of the write operation, a state transition recognition signal for stopping the write operation of the read/write circuit may be outputted.

In the detecting of the state transition of the data cell and the ending of the write operation according to the state transition of the data cell, the resistance of the selected data cell may be compared with the reference resistance of the reference cell, and when a state of the data cell is different from a result of the write operation, a state transition recognition signal for maintaining the write operation of the read/write circuit may be outputted.

FIG. 5B illustrates a write operation of writing a data '0' in the target data cell 453.

A bit line signal $BL_0$ and a word line signal $WL_0$ may be respectively inputted to the gates of the eighth and $10^{th}$ transistors T8 and T10 so as to select the target data cell 453. According to the embodiment of the present invention, the target data cell 453 may be selected based on the bit line signal $BL_0$ and the word line signal $WL_0$. To write a data '0' in the target data cell 453, a ground voltage may be applied to the gate of the ninth transistor T9 as an input signal INPUT, and the power source voltage VDD may be applied to the gate of the $11^{th}$ transistor T11 as an inverted input signal INPUTb. As a result, the ninth transistor T9 may be turned off, the $11^{th}$ transistor T11 may be turned on and a current path may be formed through the second switch S2, the eighth transistor T8, the target data cell 453, the $10^{th}$ transistor T10, and the $11^{th}$ transistor T11.

To perform a write operation, a write voltage Vwrite may be inputted to the gates of the first and second transistors T1 and T2. As a result, a data '0' may be written in the target data cell 453. Subsequently, the write operation signal $W_{EN}$ and the sense signal SENSE may be inputted to the AND gate 423 and the OR gate 424, respectively. The write operation signal $W_{EN}$ and the sense signal SENSE may have a logic high level, e.g., '1', individually.

The voltages of the second node n2 and the third node n3 may be applied to the input terminals of the comparator 421. In this way, the current state of the target data cell 453 may be reflected into the non-inversion input terminal of the comparator 421, and the current state of the reference cell 457 may be reflected into the inversion input terminal of the comparator 421.

When the current state of the target data cell does not represent data '0' (that is, when the current state of the target data cell represent '1'), the comparator 421, the third switch S3, and the fourth switch S4 may output a comparison signal of a logic high level. When the current state of the target data cell represents data '0' (that is, when the current state of the data cell represents '0'), it means that the write operation is finished and thus the comparator 421, the third switch S3, and the fourth switch S4 may output the comparison signal of a logic low level.

When the comparator 421, the third switch S3, and the fourth switch S4 output the comparison signal of a logic high level, the AND gate 423 and the OR gate 424 may output a signal of a logic high level and the second state transition recognition signal ENb may have a logic low level. Therefore, the fifth and sixth transistors T5 and T6 of the read/write circuit 410 may be maintained to be enabled and the write operation may be performed continuously.

Conversely, when, the comparator 421, the third switch S3, and the fourth switch S4 output the comparison signal of a logic low level, the AND gate 423 may output a signal of a logic low level. When the sense signal SENSE inputted to the OR gate 424 transitions from a logic high level to a logic low level, the OR gate 424 may output a signal of a logic low level and the second state transition recognition signal ENb may have a logic high level. Therefore, the fifth and sixth transistors T5 and T6 of the read/write circuit 410 may be disabled and the write operation may stop. In short, when the state transition of the target data cell 453 occurs, the write operation may end, which may lead to remarkable decrease in the power consumption.

FIG. 5C illustrates a write operation of writing a data '1' in the target data cell 453.

A bit line signal $BL_0$ and a word line signal $WL_0$ may be respectively inputted to the gates of the eighth and $10^{th}$ transistors T8 and T10 so as to select the target data cell 453. According to the embodiment of the present invention, the target data cell 453 may be selected based on the bit line signal $BL_0$ and the word line signal $WL_0$. To write a data '1' in the target data cell 453, the power source voltage VDD may be applied to the gate of the ninth transistor T9 as the input signal INPUT, and the ground voltage may be applied to the gate of the $11^{th}$ transistor T11 as the inverted input signal INPUTb. As a result, the $11^{th}$ transistor T11 may be turned off, the ninth transistor T9 may be turned on and a current path may be formed through the first switch S1, the $10^{th}$ transistor T10, the target data cell 453, the eighth transistor T8 and the ninth transistor T9.

To perform a write operation, a write voltage Vwrite may be inputted to the gates of the first and second transistors T1 and T2. As a result, a data '1' may be written in the target data cell 453. Subsequently, the write operation signal $W_{EN}$ and the sense signal SENSE of logic high levels may be inputted to the AND gate 423 and the OR gate 424 respectively.

The voltages of the second node n2 and the third node n3 may be applied to the input terminals of the comparator 421. In this way, the current state of the target data cell 453 may be reflected into the non-inversion input terminal of the comparator 421, and the current state of the reference cell 457 may be reflected into the inversion input terminal of the comparator 421.

When the current state of the target data cell does not represent data '1' (that is, when the current state of the target data cell represent '0'), the comparator 421, the third switch S3, and the fourth switch S4 may output a comparison signal of a logic high level. When the current state of the target data cell represents data '1' (that is, when the current state of the data cell represents '1'), it means that the write operation is finished and thus the comparator 421, the third switch S3, and the fourth switch S4 may output a comparison signal of a logic low level.

When the comparator 421, the third switch S3, and the fourth switch S4 output the comparison signal of a logic high level, the AND gate 423 and the OR gate 424 may output a signal of a logic high level, and the second state transition recognition signal ENb may have a logic low level. Therefore, the fifth and sixth transistors T5 and T6 of the read/write circuit 410 may be maintained to be enabled and the write operation may be performed continuously.

Conversely, when the comparator 421, the third switch S3, and the fourth switch S4 output the comparison signal of a logic low level, the AND gate 423 may output a signal of a logic low level. When the sense signal SENSE inputted to the OR gate 424 transitions from a logic high level to a logic low level, the OR gate 424 may output a signal of a logic low level and the second state transition recognition signal ENb may have a logic high level. Therefore, the fifth and sixth transistors T5 and T6 of the read/write circuit 410 may be disabled and the write operation may stop. In short, when the state transition of the target data cell 453 occurs, the write operation may end, which may lead to remarkable decrease in the power consumption.

Figure 6:
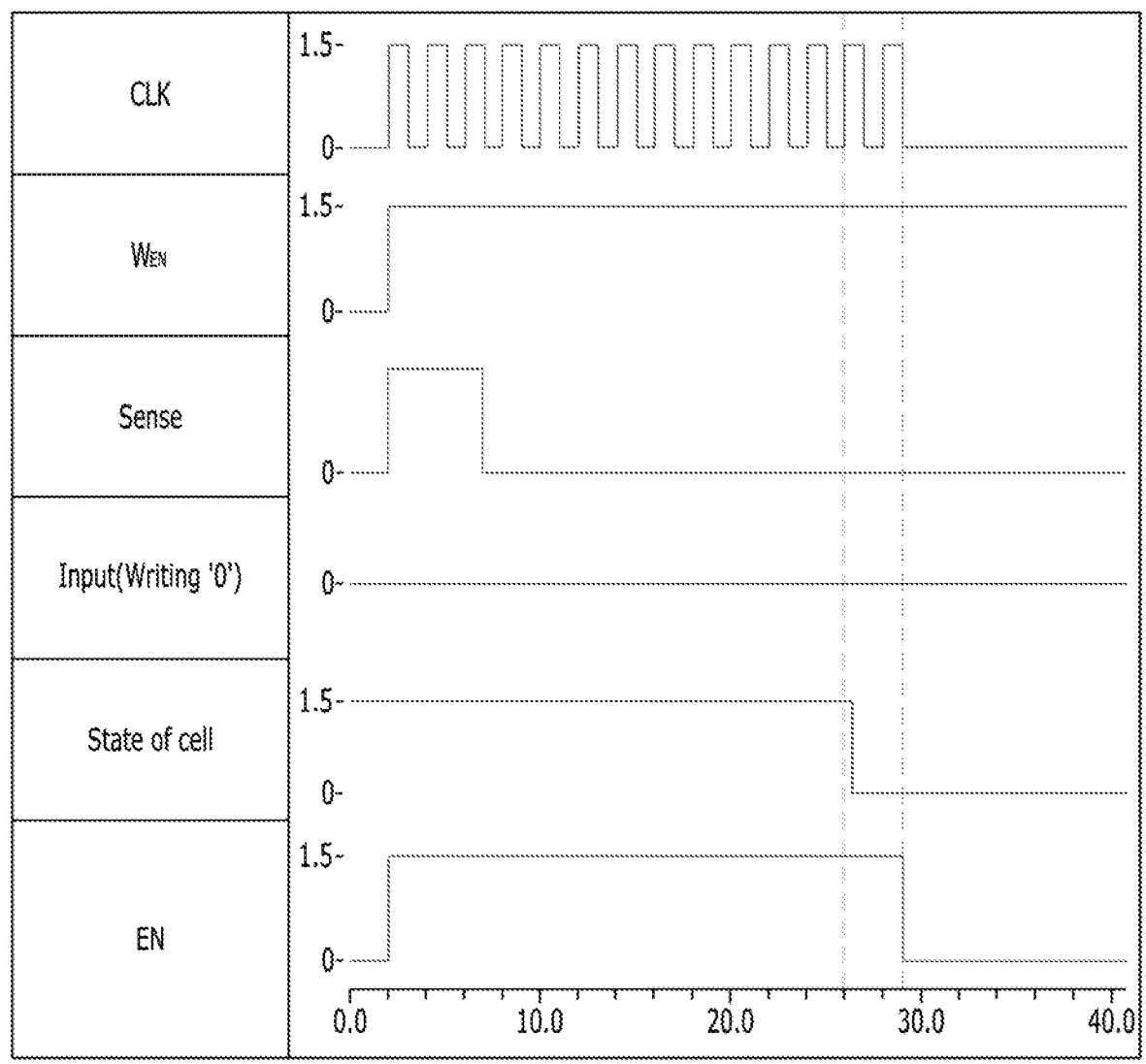
FIG. 6 is a waveform diagram illustrating states of signals of the memory device shown in FIG. 4.

FIG. 6 is a waveform diagram illustrating states of signals of the memory device of FIG. 4. The x axis may represent time based on the unit of ns, and the y axis may represent voltage based on the unit of V.

When the write voltage Vwrite is, inputted to the gates of the first and second transistors T1 and T2 to perform a write operation, the write operation may begin.

When the write operation is an operation of writing a data '0' in the target data cell 453, 0V may be applied to the memory device as the input signal INPUT. The inverted input signal INPUTb may have a voltage level of the power source voltage VDD. When the write operation is an operation of writing a data '1' in the target data cell 453, the power source voltage VDD may be applied to the memory device as the input signal INPUT. The inverted input signal INPUTb may have a voltage level of 0V.

Referring to FIG. 6, at approximately 2.0 ns, the clock CLK, the write operation signal $W_{EN}$, the sense signal SENSE, and the first state transition recognition signal EN may have a logic high level.

Since the clock CLK is a result of an AND operation onto the first state transition recognition signal EN and the reference clock, the clock CLK may operate only in a section where the first state transition recognition signal EN has a logic high level.

The write operation signal $W_{EN}$ may be inputted into the AND gate 423 of the state transition recognition circuit 420, and the sense signal SENSE may be inputted into the OR gate 424 of the state transition recognition circuit 420.

The write operation signal $W_{EN}$ may have a logic high level when a write operation begins and write operation signal $W_{EN}$ may have a logic low level when a write operation ends.

The sense signal SENSE may be used to sense the current state of a target data cell during a write operation. When the write operation signal $W_{EN}$ is enabled, the sense signal SENSE may be enabled to have a logic high level. When the current state of the target data cell is sensed, the logic level of the sense signal SENSE may transition from the logic high level to a logic low level. The transition of the sense signal SENSE may mean identification of the current state of the target data cell during a write operation. Therefore the state transition of the target data cell may occur when the sense signal has a logic low level.

When the state of the target data cell transitions from the original state to '1' to '0' at approximately 26.0 ns, which is a resultant state of performing a write operation, the clock CLK and the first state transition recognition signal EN may be disabled. As illustrated in FIG. 6, the first state transition recognition signal EN may transition from a logic high level to a logic low level at approximately 29.0 ns, which is a moment approximately 3.0 ns passes from approximately 26.0 ns, which is a moment when the state transition of the data cell has occurred. Also, since the first state transition recognition signal EN is disabled, the clock CLK may also be disabled after the state transition of the target data cell.

When the state transition of the data cell 453 occurs, the comparator 421 the third switch S3, and the fourth switch S4 may output the comparison signal of a logic low level. The comparison signal may be inputted to the D-flipflop 422, and the D-flipflop 422 may output a signal of a logic low level to the AND gate 423. In response to the signal of a logic low level inputted to the AND gate 423, the AND gate 423 may output a signal of a logic low level to the OR gate 424. In response to the signal of a logic low level inputted to the OR gate 424, the OR gate 424 may output the first state transition recognition signal EN of a logic low level. The inverter 425 may output the second state transition recognition signal ENb of a logic high level. The second state transition recognition signal ENb may be inputted to the fifth and sixth transistors T5 and T6 so as to stop the operation of the read/write circuit 410.

Hereafter, a read operation of the memory device will be described. The read operation may be described with reference to FIG. 5B.

During a read operation, the seventh transistor T7 coupled to the reference cell 457 may be turned on. As described above, during a write operation and a read operation, a reference bit line signal $BL_{ref}$ and a reference word line signal $WL_{ref}$ of a logic high level may be respectively applied to gates of the seventh and $12^{th}$ transistors T7 and T12, between which the reference cell 457 is coupled. Therefore, the third node n3 may have a voltage of the reference cell 457 during a write operation and a read operation and the current state of the reference cell 457 may be reflected into an inversion input terminal of a comparator 421, which will be described later.

The bit line signal $BL_0$ and a word line signal $WL_0$ may be respectively inputted to the gates of the eighth and $10^{th}$ transistors T8 and T10 so as to select the target data cell 453. According to the embodiment of the present invention, the target data cell 453 may be selected based on the bit line signal $BL_0$ and the word line signal $WL_0$.

Differently from a write operation, a read operation may be performed regardless of the direction of a current. Therefore, in this embodiment of the present invention, a ground voltage (e.g., approximately 0 V) is applied as the input signal INPUT in order to form a general read current path. As a result, the ninth transistor T9 may be turned off, the $11^{th}$ transistor T11 may be turned on and a current path is formed through the second switch S2, the eighth transistor T8, the target data cell 423, the $10^{th}$ transistor T10, and the $11^{th}$ transistor T11.

To perform a read operation, a read voltage Vread may be inputted to the gates of the first and second transistors T1 and T2. Subsequently, the sense signal SENSE may be inputted to the OR gate 424, and the write operation signal $W_{EN}$ having a logic low level may be inputted to the AND gate 423. As a result, the read operation may be performed to the memory device only in a section where the sense signal SENSE has a logic high level.

As a result of the read operation, the comparator 421 may compare the voltage of the target data cell 453 with the voltage of the reference cell 457 and output a comparison signal based on the comparison result. The comparison signal may be outputted through the third and fourth switches S3 and S4, and the D-flipflop 422 may output a predetermined signal corresponding to the inputted comparison signal. Herein, data may be read as a sensing circuit (not shown) senses the output of the comparator 421, the output of the third switch S3, or the output of the D-flipflop 422.

Meanwhile, the constituent elements of the embodiment may be easily figured out from the perspective of process. In other words, each of the constituent elements may be figured out by its process. Also, the process of the above-described embodiment of the present invention may be easily understood in terms of the constituent elements of a device.

Also, the technical description may be realized in the form of a program command that may be executed through diverse means of a computer and registered in a computer-readable recording medium. The computer-readable recording medium may include a program command, a data file, a data structure or a combination thereof. The program command recorded in the medium may be specifically designed or formed for the embodiments or known and available to those skilled in the field of computer software. The non-limiting examples of the computer-readable recording medium may include magnetic media such as a hard disk, a floppy disk and a magnetic tape, optical media such as a Compact Disk Read Only Memory (CD-ROM) and a Digital Versatile Disc (DVD), magneto-optical media such as a floptical disk, and hardware devices that are formed to store and execute program commands, such as a Read Only Memory (ROM) a Random Access Memory (RAM), and a flash memory. Non-limiting examples of the program commands may include not only machine language code that are generated by a compiler but also high-level language code that may be executed by a computer by using an interpreter. The hardware devices may be formed to operate as one or more software modules to perform the operations described in the embodiments of the present invention, and vice versa.

According to the embodiments of the present invention, the memory device may effectively stop a write operation substantially instantly when the state transition of a data cell occurs, and an operating method of the memory device. Therefore, the memory device may reduce its power consumption during a write operation, which leads to increased durability thereof.

While the present invention has been described with respect to specific embodiments, it will be apparent to those skilled in the art that various changes and modifications may be made without departing from the spirit and scope of the invention as defined in the following claims.

What is claimed is:

1. A semiconductor memory system comprising:
  a memory device including a target data cell and a reference cell;
  a read/write circuit suitable for using a power source voltage applied through a first terminal and one of a read voltage and a write voltage applied through second terminals to selectively perform one of a read operation and a write operation to the target data cell; and
  a state transition recognition circuit suitable for comparing voltage levels on nodes of paths, each of the paths including either the target data cell or the reference cell, with each other, detecting a state transition of the target data cell based on a comparison result during the write operation, and cutting the power source voltage from the nodes of the paths according to the state transition of the target data cell for ending the write operation to the target data cell,
  wherein the nodes are located between the first terminal and the second terminals.

2. The semiconductor memory system of claim 1, wherein the reference cell has a reference resistance.

3. The semiconductor memory system of claim 2, wherein the state transition recognition circuit ends the write operation by providing a state transition recognition signal to the read/write circuit.

4. The semiconductor memory system of claim 3, wherein the state transition recognition circuit ends the write operation by providing the read/write circuit with the state transition recognition signal, which has a first logic level to deactivate the read/write circuit according to the detection result of the state transition of the target data cell.

5. The semiconductor memory system of claim 4, wherein the state transition recognition circuit detects the state transition of the target data cell by comparing a resistance of the target data cell with the reference resistance of the reference cell.

6. The semiconductor memory system of claim 5, wherein, when a current state of the target data cell represents data to be written into the target data cell, the state transition recognition circuit provides the read/write circuit with the state transition recognition signal of the first logic level.

7. The semiconductor memory system of claim 6, wherein, when the current state of the target data cell does not represent the data to be written into the target data cell, the state transition recognition circuit provides the read/write circuit with the state transition recognition signal of a second logic level.

8. The semiconductor memory system of claim 1,
wherein the state transition recognition circuit becomes activated at a start of the write operation, and
wherein the state transition recognition circuit becomes deactivated at a completion of the state transition of the target data cell.

9. A method for operating a semiconductor memory system including a target data cell and a reference cell, the method comprising:
enabling a read/write circuit, based on a read voltage and/or a write voltage applied through second terminals and a power source voltage applied through a first terminal, for selectively performing one of a read operation and a write operation to the target data cell;
comparing voltage levels on nodes of paths, each of the paths including either the target data cell or the reference cell, with each other, wherein the nodes are located between the first terminal and the second terminals;
detecting a state transition of the target data cell based on a comparison result during the write operation; and
cutting the power source voltage from the nodes of the paths according to the state transition of the target data cell for ending the write operation to the target data cell.

10. The method of claim 9, wherein the reference cell has a reference resistance.

11. The method of claim 10, wherein the ending of the write operation includes providing a state transition recognition signal to the read/write circuit.

12. The method of claim 11, wherein the ending of the write operation includes providing the read/write circuit with the state transition recognition signal, which has a first logic level to deactivate the read/write circuit according to the detection result of the state transition of the target data cell.

13. The method of claim 12, wherein the detecting of the state transition includes comparing a resistance of the target data cell with the reference resistance of the reference cell.

14. The method of claim 13, wherein the state transition recognition signal of the first logic level is provided when a current state of the target data cell represents data to be written into the target data cell.

15. The method of claim 14, wherein the ending of the write operation includes providing the read/write circuit with the state transition recognition signal of a second logic level when the current state of the target data cell does not represent the data to be written into the target data cell.

16. A state transition recognition circuit comprising:
a comparator configured to compare voltage levels on nodes of paths, each including either a target data cell or a reference cell, with each other, wherein the comparator is coupled to a read/write circuit enabled based on a read voltage and/or a write voltage applied through second terminals and a power source voltage applied through a first terminal, for selectively performing one of a read operation and a write operation to the target data cell among data cells and the reference cell, wherein the nodes are located between the first terminal and the second terminals; and
a state transition recognition unit configured to output a state transition recognition signal based on an output of the comparator into the read/write circuit during the write operation,
wherein the state transition recognition signal is used to cut the power source voltage from the nodes of the paths to end a write operation of the read/write circuit.

17. The state transition recognition circuit of claim 16, wherein the comparator outputs a comparison signal according to whether or not a current state of the target data cell represents data to be written into the target data cell.

18. The state transition recognition circuit of claim 17, wherein, when the current state of the target data cell represents data to be written into the target data cell, the state transition recognition unit provides the read/write circuit with the state transition recognition signal, which has a first logic level to deactivate the read/write circuit.

19. The state transition recognition circuit of claim 18, wherein, when the current state of the target data cell does not represent the data to be written into the target data cell, the state transition recognition unit provides the read/write circuit with the state transition recognition signal of a second logic level.

20. The state transition recognition circuit of claim 19,
wherein the state transition recognition circuit becomes activated at a start of the write operation,
wherein the state transition recognition circuit becomes deactivated at a completion of the state transition of the target data cell; and
wherein the comparator compares a resistance of the target data cell with a reference resistance of the reference cell.

* * * * *